(12) United States Patent
Huang et al.

(10) Patent No.: US 10,372,868 B2
(45) Date of Patent: Aug. 6, 2019

(54) ERROR RESILIENT DIGITAL SIGNAL PROCESSING DEVICE

(71) Applicants: IMEC VZW, Leuven (BE); Katholieke Universiteit Leuven, KU LEUVEN R&D, Leuven (BE)

(72) Inventors: Yanxiang Huang, Leuven (BE); Chunshu Li, Leuven (BE); Meng Li, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/886,877

(22) Filed: Oct. 19, 2015

(65) Prior Publication Data

US 2016/0110492 A1    Apr. 21, 2016

(30) Foreign Application Priority Data

Oct. 20, 2014 (EP) .................................... 14189572

(51) Int. Cl.
*G06F 9/445* (2018.01)
*G06F 17/50* (2006.01)
*H03K 3/037* (2006.01)

(52) U.S. Cl.
CPC ...... *G06F 17/5081* (2013.01); *G06F 17/5045* (2013.01); *H03K 3/0375* (2013.01)

(58) Field of Classification Search
CPC ............. G06F 17/5072; G06F 17/5022; G06F 17/5077; G06F 17/5068; G06F 17/5045; G06F 17/5054; G06F 17/50; G06F 17/5036; G06F 11/261; G06F 13/105; G06F 17/5009; G06F 17/5027; G06F 2217/86; G06F 17/05

USPC .................................................. 716/110–117
See application file for complete search history.

(56) References Cited

U.S. PATENT DOCUMENTS

| 4,231,102 | A | 10/1980 | Barr et al. |
| 8,332,451 | B2 | 12/2012 | Gangalakurti et al. |
| 2007/0016881 | A1* | 1/2007 | Gregory .............. G06F 17/5031 716/108 |

(Continued)

FOREIGN PATENT DOCUMENTS

WO    2006/083940 A3    10/2006

OTHER PUBLICATIONS

Ernst, Dan et al., "Razor: A Low-Power Pipeline Based on Circuit-Level Timing Speculation", Proceedings of the 36th International Symposium on Microarchitecture (MICRO-36'03), 2003, 12 pages.

(Continued)

*Primary Examiner* — Binh C Tat
(74) *Attorney, Agent, or Firm* — McDonnell Boehnen Hulbert & Berghoff LLP

(57) ABSTRACT

The present disclosure relates to an error resilient scheme for a signal processing device configured to perform iterative processing on clocked input data and to provide output data. The signal processing device includes a computation circuit comprising at least one computation unit circuit configured to perform one computation in each iteration on the clocked input data and to provide or generate processed data, and a selection circuit configured to provide as the output signal either the processed data or the clocked input data, depending on a control signal representative of a set-up timing error detected in an input data.

11 Claims, 8 Drawing Sheets

(56) References Cited

U.S. PATENT DOCUMENTS

2008/0148009 A1* 6/2008 Doerr .................. G06F 15/8023
                                                         712/11
2008/0276210 A1* 11/2008 Albrecht ............. G06F 17/5031
                                                        716/113
2010/0131912 A1* 5/2010 ispir .................... G06F 17/5045
                                                        716/118
2010/0223312 A1   9/2010 Okello
2010/0271092 A1* 10/2010 Zerbe ................. G06F 13/4243
                                                        327/161

OTHER PUBLICATIONS

Bowman, Keith A. et al., "Energy-Efficient and Metastability-Immune Resilient Circuits for Dynamic Variation Tolerance", Journal of Solid-State Circuits, vol. 44, No. 1, Jan. 2009, pp. 49-63.

* cited by examiner

ERROR RESILIENT DIGITAL SIGNAL PROCESSING DEVICE

CROSS-REFERENCE TO RELATED APPLICATION

The present application is a non-provisional patent application claiming priority to European Patent Application No. 14189572.2 filed Oct. 20, 2014, the contents of which are hereby incorporated by reference.

TECHNICAL FIELD

The present disclosure is generally related to the field of digital signal processors and more specifically to algorithmic noise-tolerant signal processing devices.

BACKGROUND

In modern integrated circuits (ICs) aggressive voltage and frequency scaling is widely utilized to exploit the design margin introduced by Process-Voltage-Temperature (PVT) variations. The PVT variations result into a randomized variability of the transistor parameters, e.g. gate width and length, channel mobility, threshold voltage Vth. Besides, supply voltage Vdd is also fluctuating due to noise or IR drop. As a consequence, the propagation delays of two theoretically identical transistors are different. This phenomenon becomes more significant with the advancement of CMOS technology. In addition, scaling the supply voltage and/or frequency beyond the critical voltage or frequency of a transistor results in numerous timing errors and, hence, unacceptable output quality.

To cope with the transistor variability, ICs are conventionally designed at the worst PVT corner to ensure the transistors always operate correctly in synchronized circuits. Nevertheless, ICs rarely operate at the worst corner. Therefore, this worst case approach introduces a design margin, leading to wasted performance capability and power consumption.

Recently, on-chip monitor techniques have been proposed to reduce this design margin. On-chip monitors, e.g. voltage and/or timing monitors, are embedded in the ICs to estimate the timing slacks during operation. The "slack" is the difference between the required time (in this case the clock period) and the arrival time. If the slack is positive or zero, the logic is fast enough for the computation. If the slack is negative, the logic is too slow. If the timing slack is too large, the system can reduce the voltage (to save power) or increase the clock frequency (to increase speed). By reducing the voltage or increasing the clock frequency, the computations are completed within a longer period of time which in turn reduces the timing slack. In the end, when the timing slack is close to zero, the voltage and clock frequency are kept constant to assure the computations are completed within the time budget. Operating an IC at a specific voltage and a clock frequency for which the timing slack is zero is called a critical operating point. Scaling the supply voltage and/or frequency beyond that critical point will result into a negative timing slack, which leads to timing errors. Besides, other parameters, e.g. temperature, CMOS body biased voltage, transistor aging, also affects the timing slack and, hence, the critical point.

In-situ schemes based on a timing-error detection scheme (EDS) and an error correction scheme (ECS) have been proposed. For the timing-error detection scheme (EDS) on-chip timing monitors, such as Razor-based monitors (Razor) and Double Sampling with Time Borrowing (DSTB), are widely used. They are proposed to replace the Flip-Flop (FF) in the circuit. By using this EDS it is detected whether a path violates the set-up timing constraint (timing slack).

A Razor-based monitor detects a timing error in a main flip-flop (FF) with a shadow latch as described in the paper "*Razor: a low-power pipeline based on circuit-level timing speculation*," (Ernst et. al., 36th Annual IEEE/ACM Int'l Symp. on Micro-Architecture, pp. 7-18, 2003). However, the Razor monitor exhibits meta-stability problem in the data path. The meta-stability problem occurs in Flip-Flop (FF) circuits when the input signal changes along with the rising edge of the clock signal. In this case, one or few transistors of the FF circuit are pulled to '1' and '0' simultaneously. The circuit will then require an unlimited time to resolve to a final state ('1' or '0'), according to the environmental noise. In the Razor circuit, this happens to the FF which is located in the data path. Thus, the system runs into a meta-stable state, which is difficult to resolve.

The DSTB monitor proposes to swap the position of the FF and the latch to eliminate the disadvantages of the Razor monitor in the data-path. In a DSTB circuit the data signal arrives later than the required timing constraint (i.e. time margin), e.g. the rising edge of the clock signal. So, the data signal will still be captured by the latch. The latch circuit is sensitive even after the rising edge of the clock signal in contrary to a flip-flop. The DSTB circuit detects a timing violation by comparing the results from the latch and the FF. As the signal from the latch can be used in the next cycle as the "correct input from the previous cycle", the DSTB can find the exact timing slack and hence utilize it to reduce the design margin. However, if the data signal arrives late, the time to perform the computation of the next cycle is insufficient and hence the computation cannot be performed. To compensate for the lack of time, error correction schemes (ECS) have been proposed.

Conventional ECSs correct a timing error, for example, by issuing extra cycles (counter flow) as proposed in the above-mentioned paper by Ernst et al or by re-issuing the instruction (instruction replay) as proposed by Bowman et al in "*Energy-Efficient and Metastability-Immune Resilient Circuits for Dynamic Variation Tolerance*" (IEEE Journal of Solid-State Circuits, vol. 44, no. 1, pp. 49-63, Jan. 2009). In both solutions extra cycles are issued to avoid computational errors, resulting in a multiple-cycle penalty. When scaling beyond the critical point, errors are generated, which are detected by EDS and corrected by ECS. A sub-critical point is defined as the point indicating the maximum negative timing slack the system can tolerate with the proposed EDS and ECS. When scaling beyond the sub-critical point, the system will fail totally. This situation should be avoided by the user.

EDS schemes as mentioned above, i.e. counter flow and instruction replay, can correct timing error at the cost of extra computation cycles. Those extra cycles result in a throughput penalty. However, for real-time streaming applications, e.g. in a communication system, a constant throughput is required for the signal processing circuits. It is critical to maintain the cycles per instruction (CPI) without throughput penalty at the situations between a critical situation and a sub-critical situation.

Hence, there is a need for an approach to deal with timing errors wherein the above-mentioned limitations are avoided or overcome.

SUMMARY

It is an object of embodiments of the present disclosure to provide for an error resilient digital signal processor and more specifically an error resilient algorithmic noise-tolerant signal processing device.

The above objective is accomplished by the solution according to the present disclosure.

In a first aspect the disclosure relates to a signal processing device arranged for performing an iterative processing on a clocked input data and for outputting an output data. The signal processing device comprises a computation circuit containing at least one computation unit circuit arranged for performing one computation in each iteration on the clocked input data and for outputting a processed data, and a selection circuit arranged for outputting as output signal either the processed data or the clocked input data depending on a control signal representative of a set-up timing error detected in an input data.

In an embodiment the computation circuit may comprise at least two computation unit circuits connected in series, each computation unit circuit arranged for performing one computation in each iteration and for outputting a processed data. In this embodiment the selection circuit is arranged for providing as output signal either one of the processed data or the clocked input data depending on the control signal.

Advantageously, the control signal indicates how many iterations are to be performed by the computation circuit, for example zero (in case of selecting the input data) or one or more (in case of selecting one of the processed data). In addition, the control signal may be masked with a signal indicating a last computation cycle. As in the last computation cycle a timing error cannot be corrected, such masking allows accounting for a timing error that may occur.

In one embodiment the computation circuit comprises a counter arranged for counting a number of performed computations by the signal processing device according to the control signal and for outputting a signal representative of the counted computations.

In another embodiment the signal processing device comprises a circuit for detecting a timing error introduced by the set-up time propagation delay. The circuit is configured for clocking the input data and for outputting the clocked input data. In case of a timing error (or timing violation), the late arriving input data signal is captured by this circuit. Accordingly the circuit outputs a control signal representative of the detected timing error. This control signal controls the operation of the computation circuit. The control signal indicates how many computation iterations are to be performed in the current computation cycle so that enough time is assured for the next computation cycle. As a result, some of the computation iterations in the current cycle may be skipped.

The circuit further outputs a control signal representative of the set-up timing error in the input data. The circuit may comprise a plurality of timing error detection circuits, such as a Double Sampling with Time Borrowing (DSTB) circuit. Each timing error detection circuit is arranged to receive one bit of the input data and outputs a local set-up timing error signal if a difference between the one bit of input data and a clock signal is detected. In addition, the timing error detection circuit may be further arranged for receiving a plurality of delayed versions of the clock signal, each of the delayed versions having a different timing offset with respect to the other and for outputting a multi-bit local set-up timing error signal. The circuit further comprises a logic circuit, such as an OR logic gate, arranged for receiving the local set-up timing error signals from each timing error detection circuits and for outputting the control signal.

In one embodiment the signal processing device may be an algorithmic noise-tolerant signal processing device, such as a CORDIC processor. In another embodiment, the computation circuit may be any iterative-based computation circuit, such as a LDPC codec, etc.

The signal processing device according to the present disclosure employs a computation-skip (CS) scheme to correct for computation errors due to timing violations. The processing device according to the present disclosure can thus operate correctly even when the operating parameters (process variability, supply voltage, operation frequency, temperature) are scaled beyond their critical value, i.e. at sub-critical conditions when either the supply voltage or the clock frequency or both set lower than the limit for timing-error-free computation. The signal processing device can thus achieve reduction in terms of power consumption and in chip area since the circuit can be under-designed.

Other embodiments of the present disclosure relate to a method for a signal processing device arranged for performing an iterative processing on a clocked input data and for outputting an output data. The method comprises performing at least one computation on a clocked version of an input data and outputting one processed data, and selecting as an output data either the one processed data or the clocked input data depending on a control signal representative of a set-up timing error detected in the input data, wherein the control signal indicates how many iterations are to be performed by the signal processing device.

Further embodiments relate to a device comprising the signal processing device as described above and to a system comprising such a device.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

DESCRIPTION OF DRAWINGS

The disclosure will now be described further, by way of example, with reference to the accompanying drawings, wherein like reference numerals refer to like elements in the various figures.

DETAILED DESCRIPTION

Figure 1:
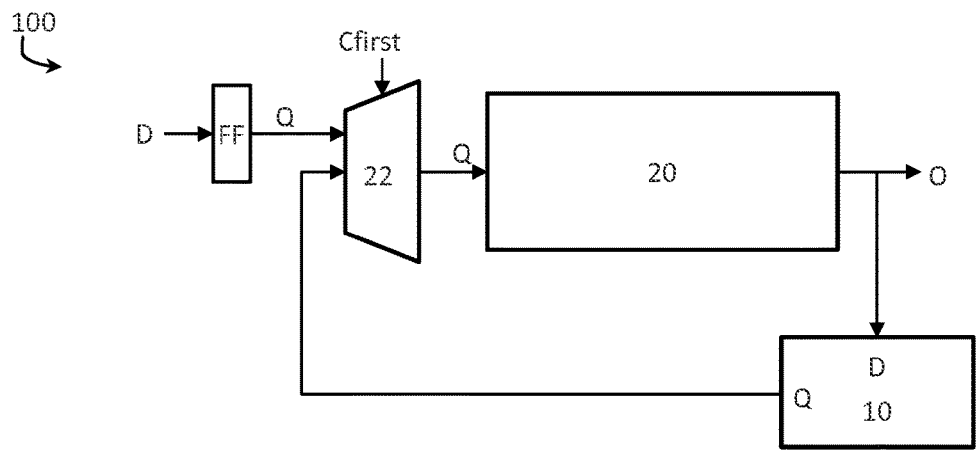
FIG. 1 illustrates an example recursive implementation of a conventional CORDIC processor.

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The output quality of a digital signal processing system, which is a very resilient requirement, is usually measured by the output bit error rate (BER) or the error vector magnitude (EVM). Errors in such system are however inevitably introduced by the unreliable environment, e.g. wireless channel inference, telegraphic noise, electromagnetic interference, quantization limit of the circuit, . . . Besides, set-up timing violations (or timing errors) in a digital circuit also introduce errors in the system. To cope with such errors, various algorithms for error detection schemes (EDS) and error correction schemes (ECS) can be employed. Those errors, altogether, affect the system's EVM. However, as long as the system's EVM requirement is met, the output quality is guaranteed. Errors due to channel interference, telegraphic noise, timing error etc. are typically corrected by an error correction code (i.e. in digital baseband) where the system output quality is traded-off for power consumption and area as long as the BER constraint is met.

A digital signal processing system is a system comprising a digital signal processor (DSP) which performs a digital processing—i.e. a series of computations—on an input data D to produce an output data O. As sufficient time is needed to perform these computations, it is required to properly deal with timing errors. On the other hand, for such systems it is critical to maintain a fixed number of cycles per instruction (CPI) while guaranteeing no throughput penalty in sub-critical situations. A set-up timing error occurs in case the input data D propagated through the computation logic circuit finally arrives at the input of a synchronized sequential element, e.g. a FF, later than the rising edge of the clock signal. Once a set-up timing error occurs, the sequential element cannot capture the correct input data anymore. This introduces an error in the computation circuit. As a result, all the following computations after the sequential element are based on wrong data.

The present disclosure relates to a timing error resilient scheme for a signal processing device and more specifically to an algorithmic noise-tolerant digital signal processing device, such as a coordinate rotation digital computer (CORDIC) processor, or any processor implementing an evolutionary algorithm such as low-density parity check (LDPC) codecs. The error resilient scheme explores the opportunity of avoiding computation errors arising in consecutive computation iterations due to timing errors.

The proposed error-resilient scheme will be explained below in more details with reference to a coordinate rotation digital computer (CORDIC) processor.

A CORDIC processor performs a simple and efficient algorithm to calculate trigonometric functions. An example application of a CORDIC processor is a Cartesian to polar coordinate vector converter for polar-based radio transmitter devices. In such radio transmitter devices, CORDIC processors are used instead of a multiplication, which is relatively power hungry. CORDIC processors are typically designed to calculate a trigonometric function in an iterative fashion. The number of iterations required in a CORDIC depends on the input precision and the output EVM.

Figure 2:
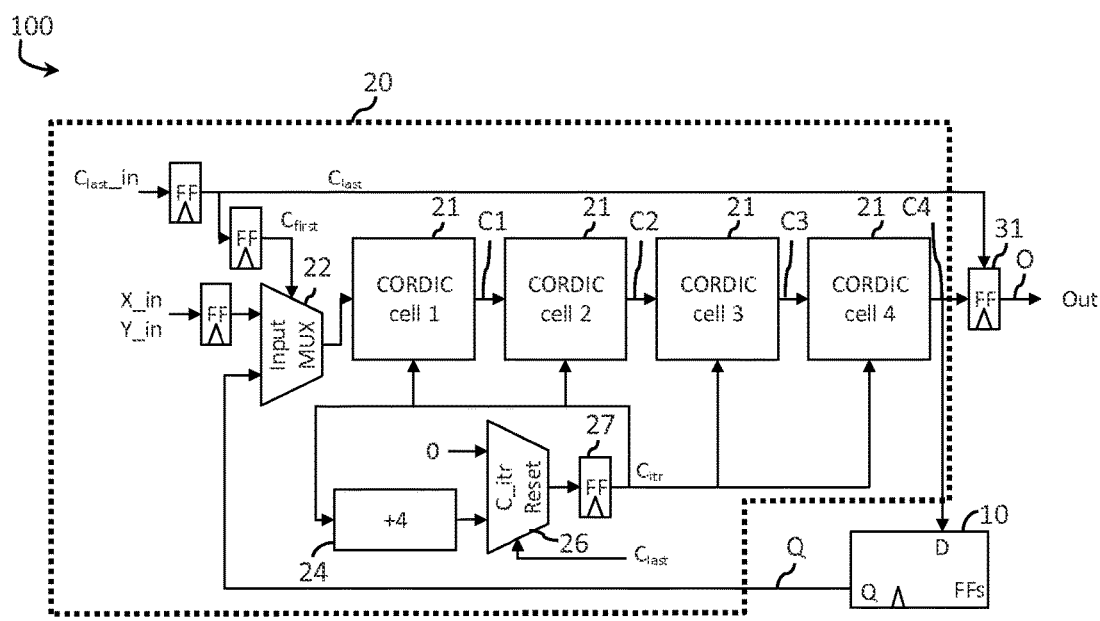
FIG. 2 illustrates a detailed schematic of the conventional CORDIC processor of FIG. 1.

An example recursive implementation of a conventional CORDIC processor 100 is shown in FIG. 1 and FIG. 2. A CORDIC processor comprises a computation logic circuit 20 which can comprise one or more processing units 21. FIG. 2 shows an example implementation with a computation logic circuit 20 comprising four processing units 21 connected in series. The processing units herein are referred to as CORDIC cell. Each of the CORDIC cells 21 performs one and the same computation. Thus, if the calculation of a single trigonometric operation (or CORDIC operation) requires 16 computations (i.e. 16 computation iterations), the CORDIC processor 100 has to perform 4 computation cycles to complete the trigonometric function calculation. In the first computation cycle (Cfirst) the CORDIC processor performs four computation iterations (i.e. n=4) on the input data (Q) to produce an intermediate output data, i.e. the processed data C4 at the output of the fourth CORDIC cell. For each subsequent computation cycle (2nd, 3rd and 4th cycles), the intermediate output data is used as an input data Q, until the required number of cycles, i.e. until last computation cycle (Clast), is reached. After the last computation cycle, the output data is fed to the output of the processor 100.

The operation of the computation circuit 20 is controlled by a control circuit comprising a plurality of flip-flop circuits and selection circuits, such as multiplexers and counters. More in detail, the processor 100 comprises a first flip-flop (FF) circuit 10 arranged for feeding the intermediate output data O of the computation circuit 20 back to its input via an input multiplexer (MUX) 22. The input MUX 22 thus controls which data, the clocked input data Q or the intermediate output data O via FF 10, is to be fed to the input of the computation circuit 20. The control circuit provides a first control signal Cfirst, indicating the first computation cycle is to be performed, which is fed at the selection input of the input MUX 22 to control its operation. Thus, if the control signal Cfirst indicates the first computation cycle is to be performed, the input data Q is fed to the input of the computation circuit 20, otherwise the intermediate output data O is fed instead. A second flip-flop circuit 31 is provided for feeding the output data O of the computation circuit 20 to the output of the CORDIC processor 100. At the last computation cycle the control circuit triggers a control signal Clast indicating the last computation cycle. This signal Clast in turns controls the second flip-flop circuit 31 to output the processed data to the output O of the processor as well as it resets the processor's control logic via multiplexer 26. Additionally, an iteration counter 24 counts the performed computation iterations. A reset circuit is further provided for resetting the iteration counter 24 to zero after completion of the required number of computations (e.g. 16 computations).

Figure 3:
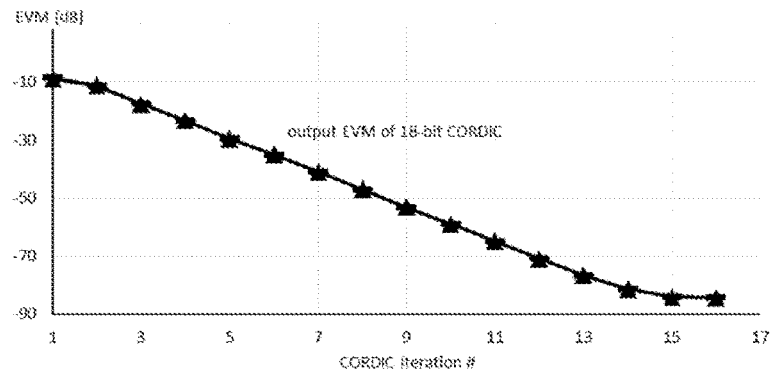
FIG. 3 shows a plot of the EVM as a function of the number of computation iterations for the conventional CORDIC processor of FIG. 1.

The timing error resilient scheme according to the present disclosure exploits the trade-offs among skipping computation iterations, energy efficiency and frequency and supply voltage over scaling. By increasing clock frequency, the system speed is increased, so the throughput and latency of the computation are both improved. By reducing the supply voltage, power consumption is reduced. This is motivated by the characteristic that the error vector magnitude (EVM) of the digital signal processor is a function of the number of computation iterations. For CORDIC, as shown in FIG. 3, the EVM value improves with the increase of the number of computation iterations. With the proposed error resilient scheme, if a timing error is detected, a number (e.g. one or more) of computation iterations are skipped to assure the data for the subsequent computations arrives on time. Skipping iterations degrades the value of EVM, however degradation is acceptable to the system. Besides, other system components might still recover the EVM degradation. As shown in the figure, the EVM saturates at the $16^{th}$ iteration, i.e. n=16. This indicates that after the $16^{th}$ iteration the number of iterations n is no longer the bottleneck for the EVM. Additionally, it can be concluded that the last computation iterations contribute least to improving the EVM value. The observed EVM characteristics, thus, offer a space for trading off the number of computation iterations beyond a critical point to assure a fixed number of cycles per instruction (CPI) is maintained and to guarantee no throughput penalty. However, increasing the clock frequency or reducing the supply voltage leads to a longer propagation delay in the computation logic circuit. This leads to less timing slack and possibly to timing errors. For the proposed error-resilient signal processing device, more frequent timing error will lead to skipping more iterations and thus may lead to a reduced output quality.

Figure 4:
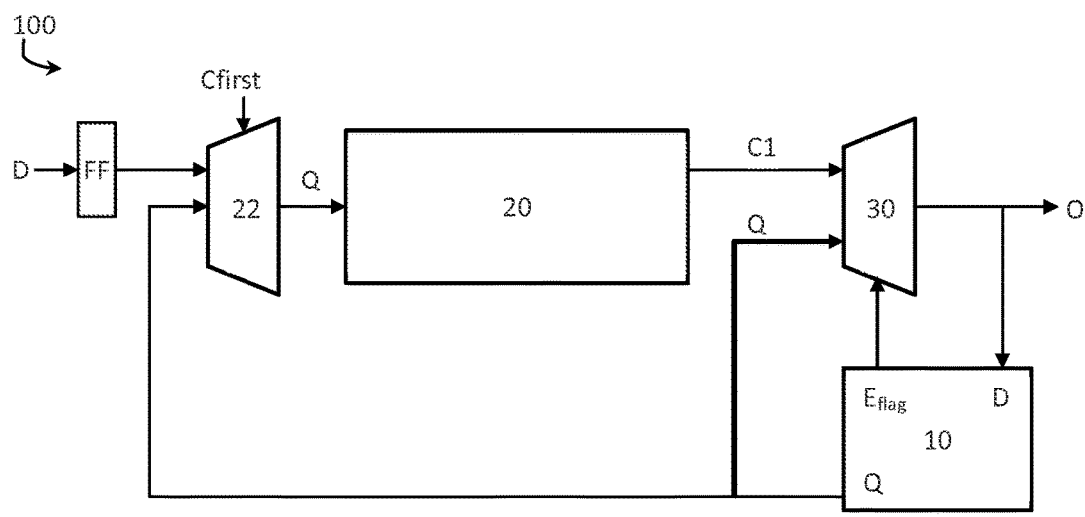
FIG. 4 illustrates an example block scheme of a recursive implementation of a CORDIC processor according to the present disclosure.

FIG. 4 shows an example of a recursive implementation of a signal processor device 100 with a timing error resilient scheme according to the present disclosure. The processing device 100 comprises a computation circuit 20 arranged for processing an input data D and for outputting a processed data C1. Accordingly, the computation circuit 20 may comprise at least one computation unit circuit 21. If the computation circuit 20 implements a CORDIC processor, the computation unit circuit 21 is referred to as a CORDIC cell. The unit circuit 21 performs one computation. The output of the computation circuit 20 is thus the output C1 of the last cell 21.

Figure 5:
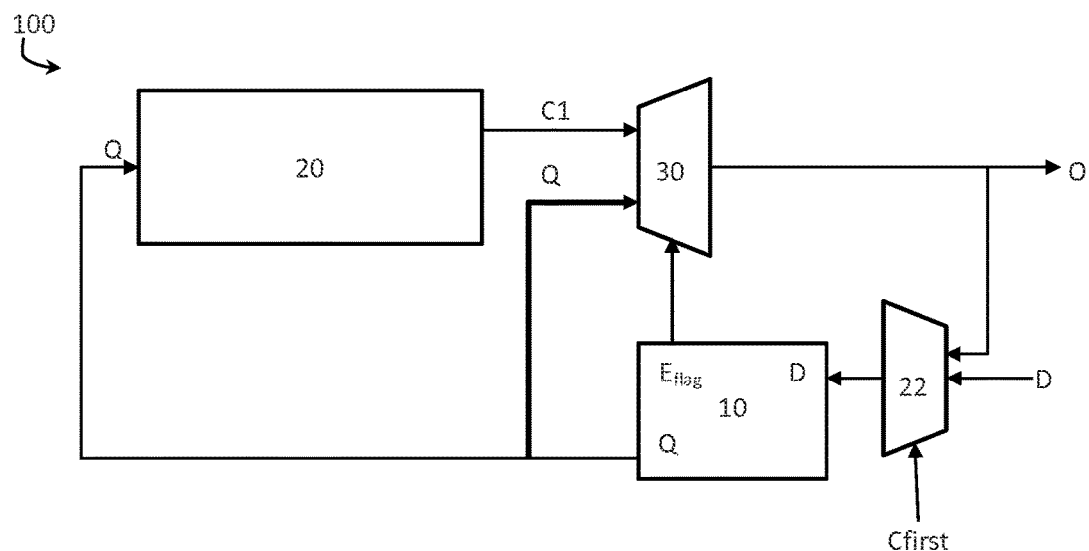
FIG. 5 illustrates an example block scheme of a recursive implementation of a CORDIC processor according to the present disclosure.
Figure 6:
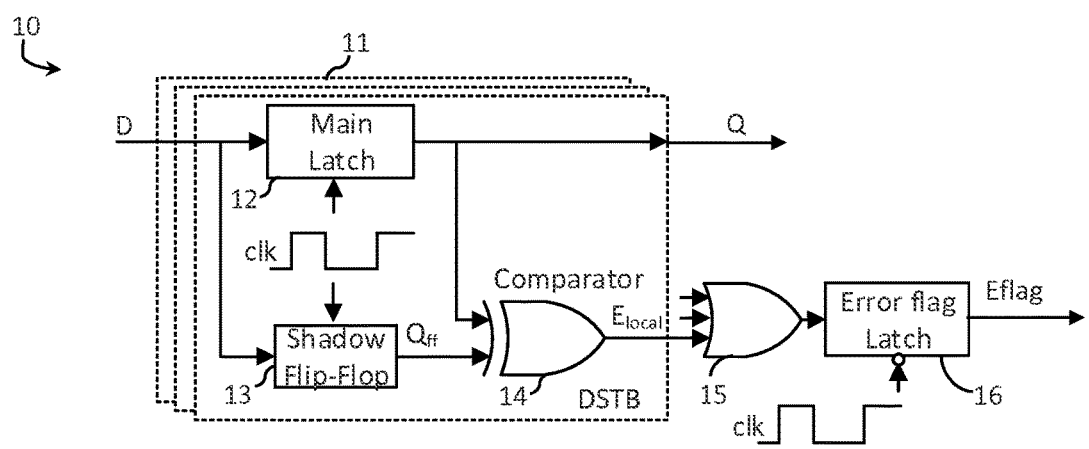
FIG. 6 illustrates an example timing error detection circuit.

As shown in FIG. 4 the input data D to the signal processing device 100 is clocked before it is fed to the computation logic circuit 20. Herein, the input data D is clocked by the FF circuit. The input data D can as well be clocked by a logic circuit 10, as shown in FIG. 5. Herein, the input MUX 22 provides input data for the logic circuit 10. Thus, according to the control signal Cfirst, the input MUX feeds to circuit 10 either the input data D or the intermediate output data from the computation circuit 20. Moreover, the circuit 10 has two functionalities: first to output a clocked input data Q to be fed to the processing circuit 20 and, second, to output a timing error signal Eflag if the circuit 10 detects a set-up timing error with respect to the input data D. A set-up timing error is detected if the input data D arrives at the input of the circuit 10 after the rising edge of the clock signal clk. Any conventional timing error detection circuit can be used as a circuit 10. A circuit implementing a double sampling with time borrowing (DSTB), as shown in FIG. 6, is preferred. The circuit 10 detects a timing error in an input data D at bit level. The circuit thus comprises a number of DTSB circuits 11 equal to the number of bits of the input data D. Each DTSB circuit 11 comprises a main latch circuit 12 and flip-flop (FF) circuit 13, both arranged for receiving the respective input data bit at the input of the circuit 11. Thus, each main latch 12 captures the respective one bit of the input signal D and produces one bit of clocked input data Q at its output. If one of the bits of the input data D arrives late at the input of the circuit 11 (i.e. after the rising edge of the clock signal clk), the positive-edge sensitive FF 13 captures an incorrect data at the rising edge of the clock signal clk and produces an output signal Off which is an incorrect sample of D. The Q signal, which is essentially the input signal D, is still correct since the latch 11 is transparent throughout the high period of the clock signal (when clk='1'). By comparing Q and Off, the comparator 14 triggers an error output signal Elocal being a logic '1'. All Elocal signals are then fed to an 'OR' gate 15 to produce a global error signal Eflag. A negative sensitive latch 16 is inserted after the 'OR' gate, so that the Eflag signal only changes after the main latch 12 is stable. This reduces the glitching of Eflag. The DSTB circuit 10 thus outputs a global timing error for the whole processor 100 if a timing error was detected with respect to any of the bits of the input data D.

The processor device 100 further comprises a selection circuit 30, for example a multiplexer. The selection circuit 30 receives at its inputs the output C1 of the computation circuit 20 (i.e. the processed data) and the input data Q. In addition, it receives the global timing error signal Eflag outputted by the circuit 10 as a selection signal. Thus, if a timing error event is triggered, the Eflag signal is '1' and the input data Q, instead of the output data C1, is fed to the output O of the processor device 100. If no timing error is triggered, the processed data C1, is fed back to the input of the timing error detection circuit 10. This recursive process is repeated until the last computation cycle is reached. Once the last cycle is reached, the output data O is not fed back to the input of the processing logic 20 but to the output O of the processor 100.

If a timing error (Eflag=1) is detected, due to the late arrival of the input data, the current computation cycle is skipped before being completed. This is done to assure signals are fed to the FF in time, so that the next computation cycle is performed on corrected input data. Herein, a whole computation cycle is done with the help of the DSTB circuit 10. Circuit 10 holds the input data Q which, in this cycle, arrived after the rising edge of the clock signal. As this input data Q is also fed to the MUX 30, once a timing error Eflag is detected, the MUX 30 is triggered to output data Q at the next cycle. In this case, the processed data C1 will be discarded.

The same computation-skip (CS) process is followed for all computation cycles, except for the last one. In the last computation cycle, it is required to skip a number of iterations or skip the whole computation cycle. This is because a timing violation in the last cycle cannot be corrected. Thus, to make sure the computation logic circuit 20 will not fail the set-up timing constraint and, hence, no computation errors occur in the last cycle, a number of computation iterations or the whole cycle is skipped. The number of computations to be skipped depends on the processor implementation. For the implementation shown in FIG. 4 and FIG. 5, the last computation cycle is skipped entirely.

This is also done to assure the CPI is kept constant when a timing error occurs in the computation cycle prior to the last one. The last computation cycle may be skipped entirely to ensure sufficient time for the completion of the computation iterations in the previous cycle even at sub-critical situations. As the computations in the last cycles contribute the least to the EVM value, it is preferred to complete the earlier computation cycles rather than performing any calculations in the last cycle.

Figure 7:
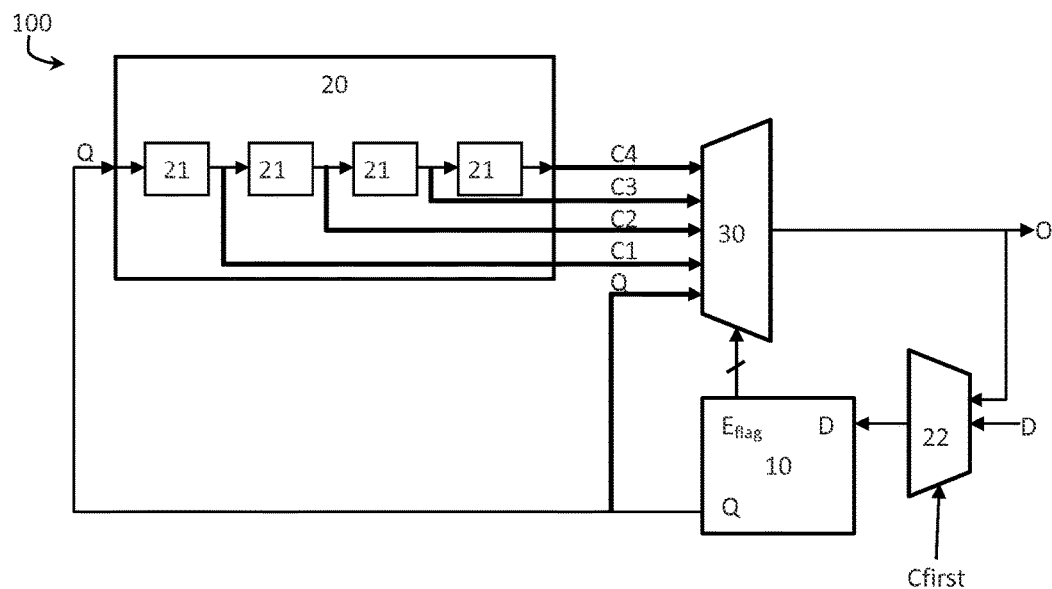
FIG. 7 illustrates an example block scheme of a recursive implementation of a CORDIC processor according to the present disclosure.

In one embodiment a modified DTSB-based circuit 10 is proposed to capture the timing slack situation. Herein, instead of using one DTSB circuit 11 to receive a single bit of the input data D as in FIG. 6, a plurality of DSTB circuits 11 connected in parallel are used. Each DTSB circuit 11 of the plurality receives a clock signal clk with a different timing offset. For example, if 4 DTSB circuits 11 are provided per one input data bit, each circuit 11 is clocked with a clock signal with a timing delay of 0%, 10%, 20% and 30%. If the input data bit arrives after the first fourth of the clock cycle and before half of the clock cycle, both DTSBs circuits clocked with 0% and 10% delayed clock signal report a timing violation—Elocal is '1'. The other DTSBs circuit 11 does not trigger a timing violation as the data bit arrived before the rising edge of the respective clock signal—DTSBs clocked with clock signal delayed with 20% and 30% will not trigger a timing error. In this example, the Elocal signal is 4 bit wide, which has a value '1100'. Similarly to the implementation of FIG. 6, herein the Elocal signals from all DTSBs circuit 11 are fed to an 'OR' gate 15 to create a global timing error signal Eflag which indicative of the amount of timing slack and not merely of a timing violation as in FIG. 6. This multi-bit Eflag signal can then be used to control the MUX 30 to choose which from the signals at the input is to be fed to its output, as shown in FIG. 7. Advantageously, the proposed modified version of DSTB circuit 10 offers information to what extent the timing is violated by the previous cycle, and, hence, will provide information on how many computation iterations from the current cycle need to be skipped to assure the processed data arrives on time for the next computation cycle. If less timing slack is left for the current computation cycle, more computations have to be skipped. For example, the Eflag signal will indicate to the MUX 30 to output the processed data C1 or the input data Q. Vice versa, if more timing slack is left, the Eflag signal will indicate to the MUX 30 to output processed data C3 or C4 for example.

Figure 8:
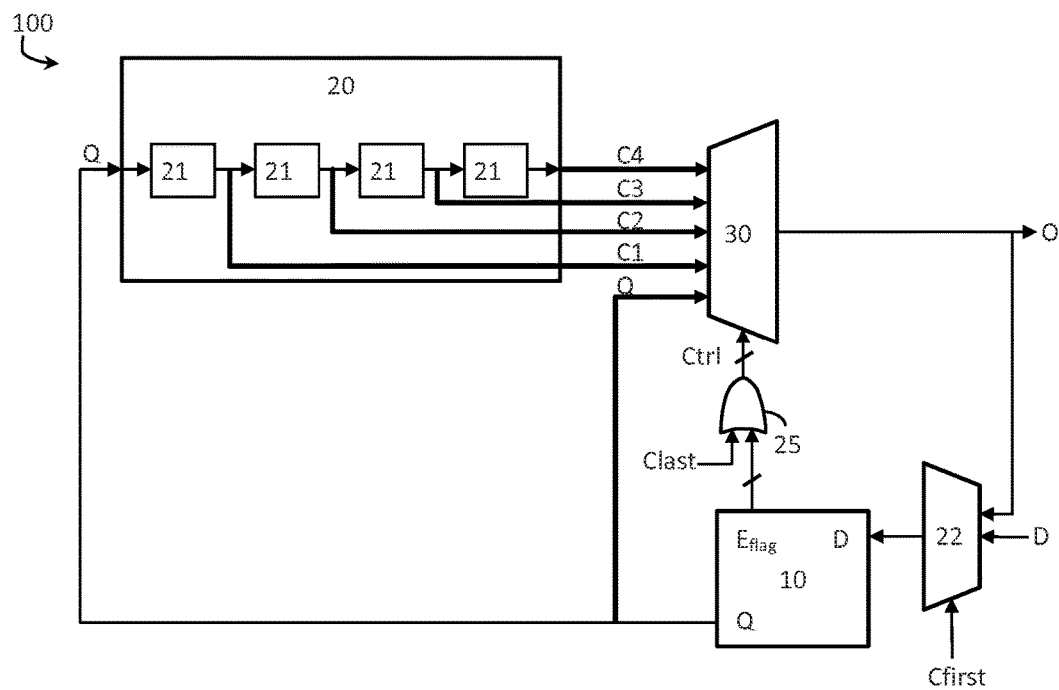
FIG. 8 illustrates an example block scheme of a recursive implementation of a CORDIC processor according to the present disclosure.

FIG. 7 shows another example embodiment of a recursive implementation of a CORDIC processor 100. Herein, the computation circuit 20 comprises four computation unit circuits 21 connected in series. Each computation cell 21 thus performs one and the same computation on the data at its input and outputs a processed data C1, C2, C3, C4 at the respective output. In this embodiment the processor 100 comprises the modified DSTB-based circuit 10 for detecting timing errors in the input data D, as described above. Thus, the Eflag signal is representative of the timing slack left, based on which only the necessary computation iteration can be skipped. For example, either a complete cycle or a certain number of iterations may be skipped. Similarly to the previous embodiment of FIG. 5, an exception case is the last computation cycle. In this case, a predetermined number of computations or the whole last computation cycle may be skipped. This is shown in more detail in FIG. 8. In this figure the Eflag signal is masked with the Clast signal indicating last computation cycle. The masking of the Eflag signal with the Clast can be performed with for example an OR gate 25. If Eflag and Clast are both '0' (false), meaning that no timing error was detected in the previous cycle and the current computation cycle is not the last cycle, the Ctrl signal will be '0' (false). Accordingly, the output of the MUX 30 is the processed data C4 from the last CORDIC cell. If either Eflag or Clast is '1' (true), the Ctrl signal triggers a certain number of computations to be skipped, e.g. Q, C1, C2, C3. The detailed implementation of the number of iterations to be skipped can be decided (a) by the designer and/or (b) according to the timing slack captured by Eflag.

Figure 9:
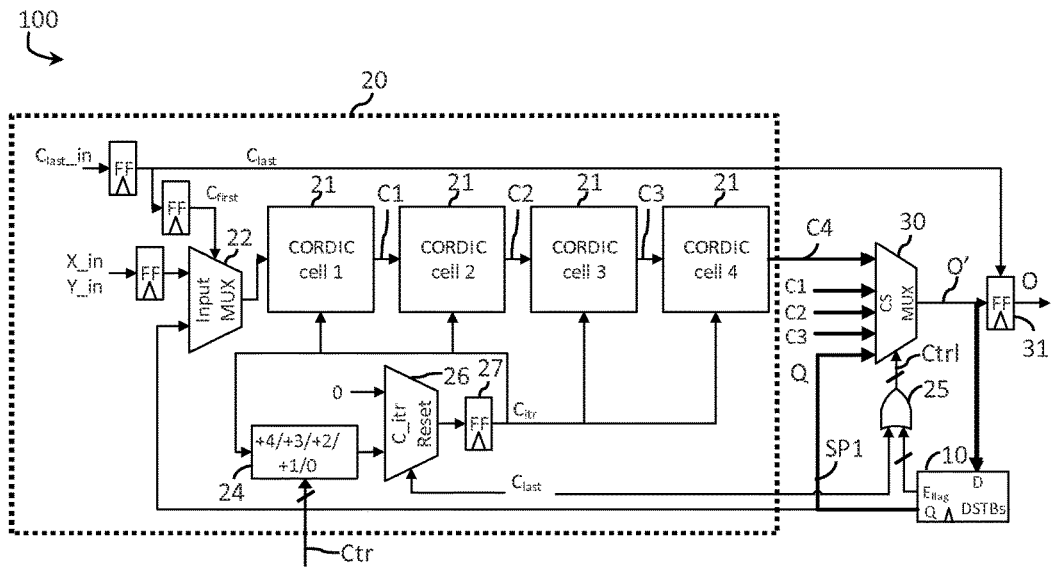
FIG. 9 illustrates an example detailed schematic of a recursive implementation of a CORDIC processor according to the present disclosure.

A detailed schematic of a CORDIC processor according to the present disclosure is shown in FIG. 9. The internal word size is 18 bit. 16 iterations are performed for each CORDIC operation. The processor contains 4 CORDIC cells connected in series, each performing one and the same CORDIC computation iteration. Therefore, 4 clock cycles are required to finish one CORDIC operation (CPI=4). The CORDIC processor operation is controlled by the control signals Cfirst and Clast, indicating if the current computation cycle is the first or the last, respectively. The Cfirst signal controls the input MUX 22 so that the correct input data is fed to the computation logic circuit 20. In the first cycle (when Cfirst='1') the input data D is fed to the computation circuit 20, otherwise the data from the computation circuit output is fed instead. The Clast signal in turn controls the MUX 30 and enables the output FF 31. After each cycle, computation output O' at the output of the MUX 30 is stored in the DSTB circuit 10, whose output data Q then serves as the input data for the next computation cycle. The signal Citr is a control signal internal to the processor 100, which is provided by a counter 24 which counts the number of the actually performed iterations by the computation circuit 20 for computing one CORDIC operation. The signal Citr is also fed to each CORDIC cell for controlling the right-shift offset in each CORDIC iteration. The computation-skip (CS) MUX 30 selects the signal from the computation circuit 20 or from the CS path, according to Eflag.

When a timing violation is detected and, depending on the timing slack, the counter 24 is either frozen (Citr is increased with +0) or increased with the number of iterations to be performed as indicated by the Eflag signal, e.g. Citr increased with +1, +2, +3. If no timing error is detected, the counter is increased with 4.

If a severe timing violation is detected, the counter 24 is frozen and the intended 4 CORDIC iterations will be actually performed one cycle later, which eats up one cycle duration. As the output CPI is kept constant, the last 4 CORDIC iterations are skipped due to this severe timing violation. As described above, the EVM value is not significantly degraded as the rotation angles in later iterations are smaller.

Advantageously, the final value of the Citr signal for a CORDIC operation provides information of how many iterations were skipped. The value of Citr can thus serve as a quality monitor, which indicates how critical the timing constraint is. Therefore, frequency f, supply voltage Vdd and threshold voltage Vth, etc., can be adjusted at run time based on this quality monitor.

Figure 10:
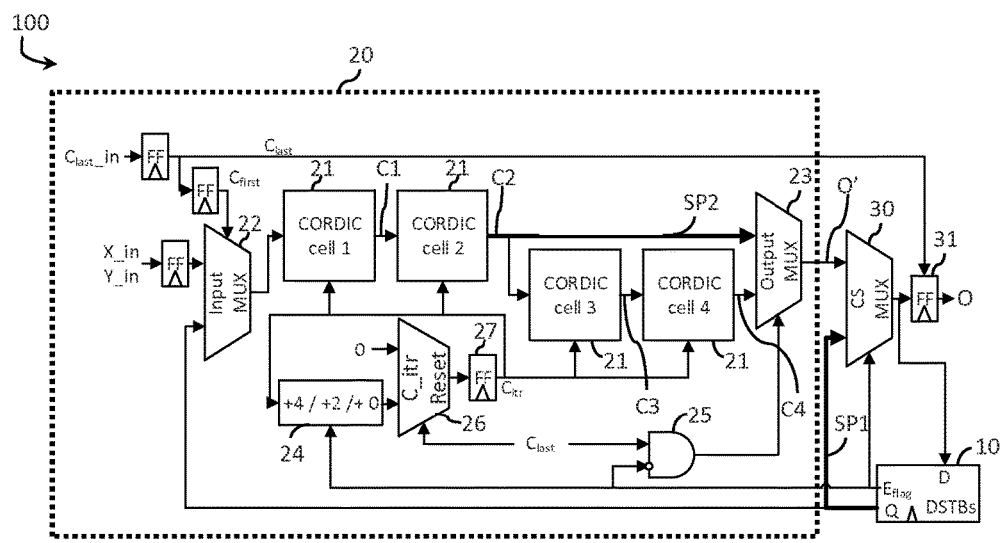
FIG. 10 illustrates an example detailed schematic of a recursive implementation of a CORDIC processor according to the present disclosure.

Another detailed schematic of a CORDIC processor according to the present disclosure is shown in FIG. 10. In this implementation, if a timing violation is detected, a predetermined number of computations (i.e. 2 computations) or all computations in the cycle are skipped. This is determined based on the cycle in which the timing violation occurred. If the timing error occurred in the cycle preceding the last one, either 2 or 4 computations are skipped, depending on the amount of timing slack. The processed data C2 or C4 is outputted by the MUX 30 depending on the Eflag signal. In the last computation cycle, to assure the computation circuit 20 does not fail the set-up timing constraint, two iterations are always skipped; the processed data D2 is outputted by the MUX 30.

Figure 12:
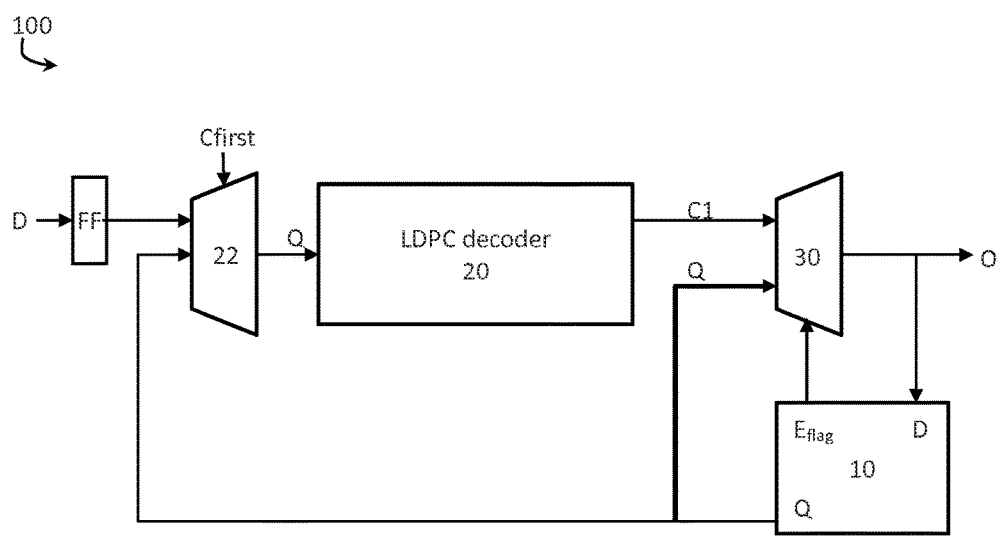
FIG. 12 illustrates an example recursive implementation of an LDPC decoder employing an error resilient scheme according to the present disclosure.

In one embodiment the computation circuit 20 is any iterative-based computation circuit, such as a CORDIC computation circuit or any computation circuit implementing an evolutionary algorithm, such a low-density parity check (LDPC) codec. An example block diagram of an LDPC codec used as a computation circuit in the proposed error resilient signal processing device 100 is shown in FIG. 12.

The data paths (CORDIC cells) are synthesized at a nominal frequency. In order to perform frequency or supply voltage over scaling, the control paths are synthesized at a higher frequency (equal to the targeted frequency over scaling limit). Since errors cannot be detected unless a cycle is finished, a timing error for the last cycle cannot be corrected. To solve this problem, during the last cycle, the outputs from CORDIC cell 2 are utilized instead of cell 4, which greatly reduces the propagation delay, and thus eliminates the occurrence of timing violations. As the last 2 CORDIC iterations are skipped, 3.4 dB EVM loss is expected. However, this loss can be predicted during design time and, hence, be compensated by other techniques, e.g. reducing the quantization error by increasing the word width.

Figure 11:
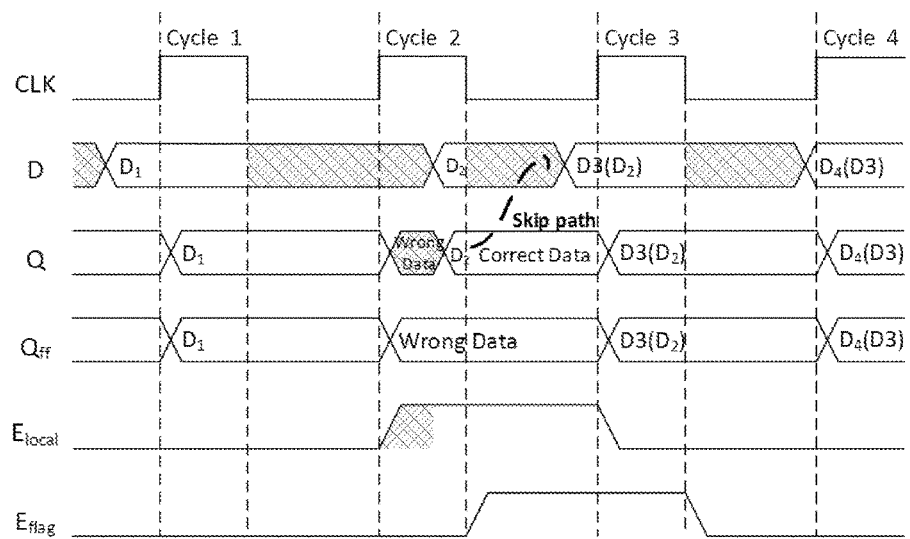
FIG. 11 shows an example timing diagram for a CORDIC processor according to the present disclosure.

An example timing diagram is shown in FIG. 11. Before cycle 1 the input signal D receives a stable data D1 ahead of the rising edge of the CLK signal. Thus, both Q and Qff get the correct data, i.e. D1, and, hence, Elocal stays low. During cycle 1 new signals from the logic are propagated to D. Suppose that the set-up constraint is violated due to a slow logic during cycle 1. Qff captures an arbitrary wrong data since D is unstable when cycle 1 finishes. However, Q keeps glitching until D is stable, when the correct signal is captured. So a positive Eflag is captured by the comparator 14, which indicates a severe timing violation Eflag (skipping the whole computation cycle is required). As a consequence, Q is directly fed to D through the CS path for the next cycle. After cycle 3, all signals are returned to the normal state and the computation for Cycle 4 can be completed on time. In this example two effective iterative calculations are performed during the first 3 cycles due to the timing violation during cycle 2.

The proposed error resilient CS CORDIC processor of FIG. 10 is compared to a conventional high-speed and a conventional low-speed CORDIC implementations. All implementations are synthesized with standard cells from TSMC 28 nm high performance mobile (HPM) bonded wafer pair (BWP). They use ULVT to meet the high speed requirement. The nominal Vdd is 0.9V. The slow-slow process variation corner is used to ensure the chip operates correctly at the worst case. Energy consumption is estimated with the toggling rate derived with realistic high bandwidth input vectors.

Figure 13:
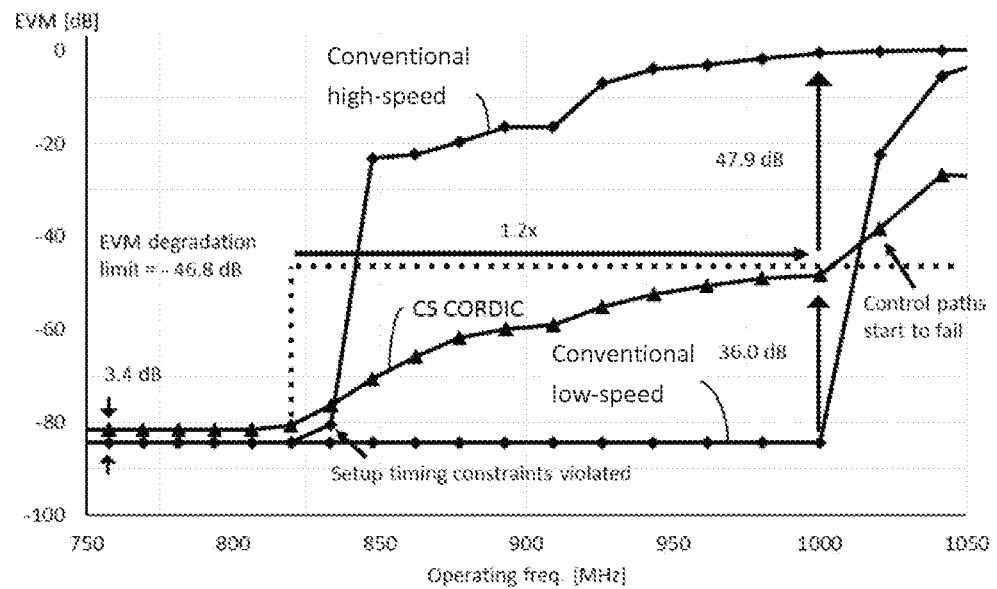
FIG. 13 shows a plot of the EVM as function of the operating frequency.

FIG. 13 shows the EVM degradation in function of the frequency for a CORDIC with the computation-skip scheme of FIG. 10, in comparison to the conventional low-speed (under-designed) and conventional high-speed (over-designed) CORDIC of FIG. 2. The EVM value for the low speed CORDIC starts reducing dramatically when the frequency increases beyond 833 MHz. The conventional high-speed CORDIC functions perfectly until scaling above 1000 MHz. This is because the low-speed CORDIC is under-designed whereas the high-speed CORDIC is over-designed. For the computation-skip (CS) CORDIC of FIG. 10, during the timing error-free operating, a 3.4 dB penalty in EVM is measured, which is caused by the last cycle protection. The EVM degrades gracefully with the clock frequency increase, as more timing paths fail and more iterations are skipped. The CS CORDIC operates correctly up to 1000 MHz, which is 1.33 times of the frequency limit for the conventional low-speed CORDIC. When the operating frequency approximates the frequency scaling limit (i.e. 1000 MHz), almost all the shadow FFs 13 fail and thus almost half of the CORDIC iterations are skipped. The degraded EVM tends to saturate at −46.8 dB, which is the theoretical EVM for 8 iterations. Beyond 1000 MHz, the EVM of the CS CORDIC degrades dramatically, due to the failing of the control paths and the CS path. At 1000 MHz, the proposed CS CORDIC achieves a 47.9 dB EVM improvement with respect to the conventional low-speed one.

Figure 14:
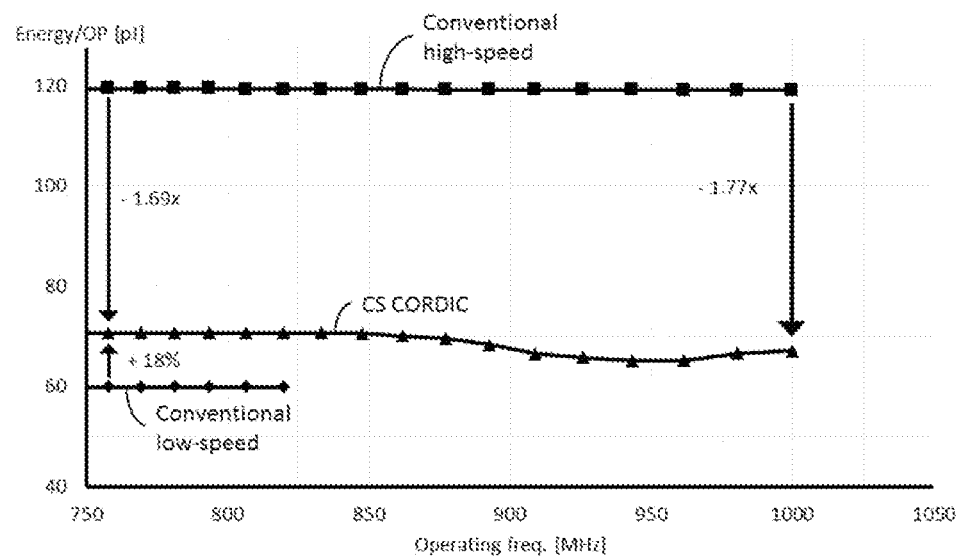
FIG. 14 shows a plot of the energy as function of the operating frequency.

The energy consumption during frequency over scaling is shown in FIG. 14. The energy numbers correspond to EVM worse than −46.8 dB are left out because those output qualities are regarded as unacceptable. At the 750 MHz (timing error-free frequency), the CS CORDIC has 18% power overhead: 8% penalty is due to the replacement of DSTBs, 8% is introduced by the extra buffers that fix the short path problem and 2% is due to the tighter time constraint introduced by those MUXs. The CS CORDIC is 1.69 times better at energy efficiency at nominal frequency with respect to the conventional high-speed CORDIC. At 1000 MHz, it reduces energy consumption by a factor of 1.77, at the penalty of 36.0 dB EVM loss. In sum, a 1.2 times frequency improvement is achieved by the CS CORDIC from the simulation.

Figure 15:
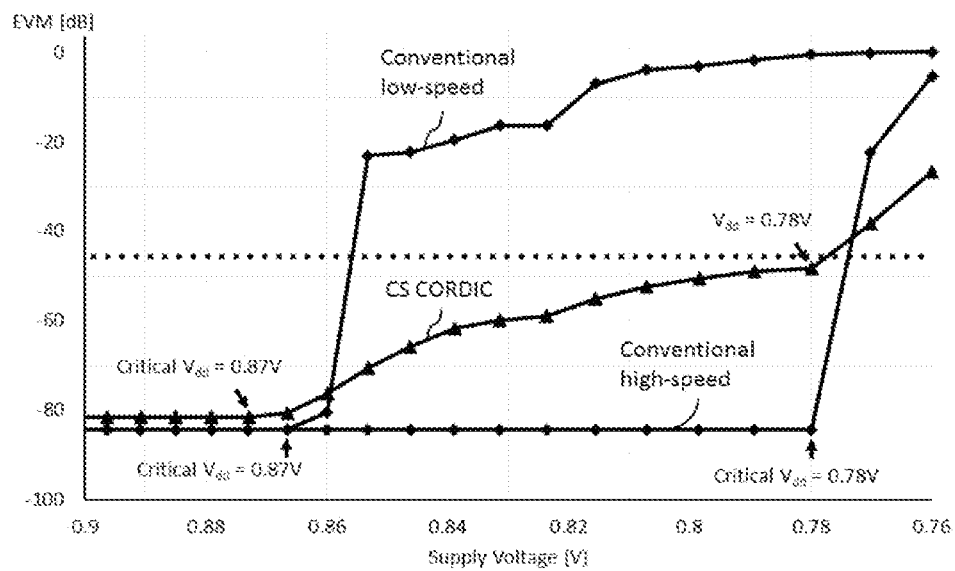
FIG. 15 shows a plot of the EVM as function of the supply voltage.

FIG. 15 shows the EVM value as a function of supply voltage scaling at 750 MHz. For conventional CORDICs scaling the Vdd lower than the critical Vdd would result in totally unacceptable outputs. In contrast to conventional CORDICs that have a rigid dependency between Vdd and output quality, the CS CORDIC operates still functions if the supply voltage is above the critical Vdd=0.87V. This property makes the CS CORDIC more robust to voltage over scaling or accidentally noise related voltage drop w.r.t. the conventional low-speed CORDIC at Vdd 0.87V. At the requirement of no control path or CS paths fails, the new critical Vdd (it is hence called sub-critical Vdd) is extended by 90 mV (from 0.87V to 0.78V).

Figure 16:
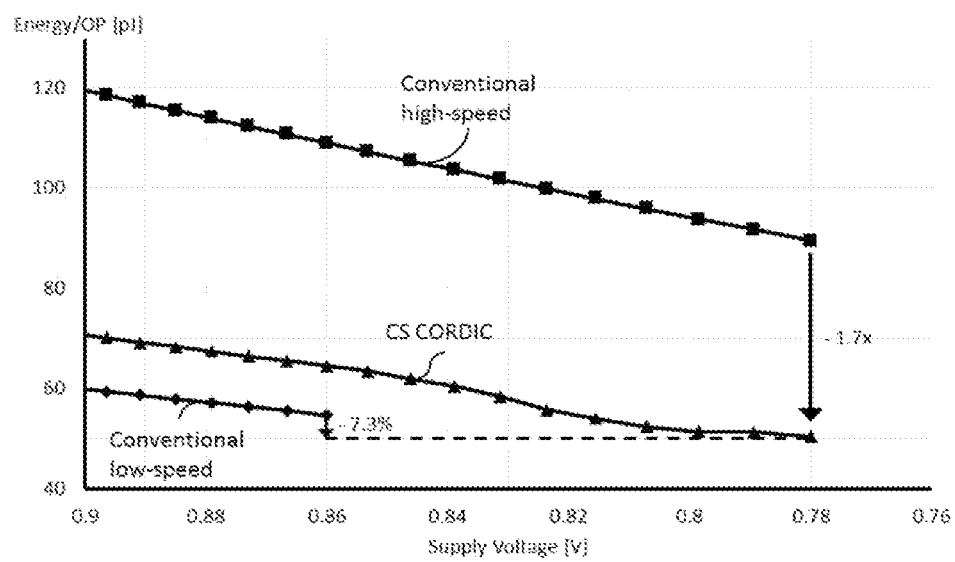
FIG. 16 shows a plot of the energy as function of the supply voltage.

FIG. 16 shows the energy consumption in function of the supply voltage. By scaling the supply voltage Vdd to 0.78V, the CS CORDIC reduces energy by 7.3% w.r.t. the conventional lows-peed CORDIC. The conventional high-speed CORDIC can also operate at 0.78V since large design margin is guaranteed. However, it consumes 1.7 times more energy.

While the disclosure has been illustrated and described in detail in the drawings and foregoing description, such illustration and description are to be considered illustrative and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A signal processing device comprising:
   a computation circuit configured to use clocked input data to generate first data corresponding to a first clock cycle;
   a logic circuit configured to generate a control signal indicating whether the signal processing device exhibited a timing error during the first clock cycle;
   a selection circuit configured to receive the control signal and, based on whether the control signal indicates that the signal processing device exhibited the timing error during the first clock cycle, provide as output, during a transition from the first clock cycle to a second clock cycle, either the first data or second data that is generated by the computation circuit and corresponds to the second clock cycle;
   a counter configured to count a number of performed computations by the signal processing device according to the control signal and to provide a signal representative of the counted computations; and
   a circuit configured to clock the input data and provide the clocked input data,
   wherein the circuit comprises a plurality of timing error detection circuits, wherein each timing error detection circuit is configured to receive one bit of the input data and to provide a local set-up timing error signal if a difference between the one bit of the input data and a clock signal is detected.

2. The signal processing device as in claim 1, wherein the computation circuit comprises at least two computation unit circuits connected in series, the at least two computation unit circuits being configured to perform respective computations of an iteration to generate the first data.

3. The signal processing device as in claim 1, wherein the control signal indicates how many iterations are to be performed by the computation circuit.

4. The signal processing device as in claim 3, wherein the control signal is masked with a signal indicating a last computation cycle.

5. The signal processing device as in claim 1, wherein each timing error detection circuit is further configured to receive a plurality of delayed versions of the clock signal, each of the delayed versions having a different timing offset with respect to the other, and to provide a multi-bit local set-up timing error signal.

6. The signal processing device as in claim 1, wherein the logic circuit is configured to receive the local set-up timing error signals from each of the timing error detection circuits and to provide the control signal.

7. The signal processing device as in claim 1, wherein the computation circuit is an iterative-based computation circuit.

8. A device comprising a signal processing device as in claim 1.

9. A system comprising a device as in claim 8.

10. A method performed by a signal processing device, the method comprising:
- using, by a computation circuit of the signal processing device, clocked input data to generate first data corresponding to a first clock cycle;
- generating, by a logic circuit of the signal processing device, a control signal indicating whether the signal processing device exhibited a timing error during the first clock cycle;
- receiving, by a selection circuit of the signal processing device, the control signal;
- based on whether the control signal indicates that the signal processing device exhibited the timing error during the first clock cycle, providing as output, during a transition from the first clock cycle to a second clock cycle, either the first data or second data that is generated by the computation circuit and corresponds to the second clock cycle;
- counting a number of performed computations by the signal processing device according to the control signal and providing a signal representative of the counted computations;
- clocking the input data and providing the clocked input data; and
- receiving one bit of the input data and providing a local set-up timing error signal if a difference between the one bit of the input data and a clock signal is detected.

11. The method as in claim 10, wherein the control signal indicates how many iterations are to be performed by the signal processing device.

* * * * *

UNITED STATES PATENT AND TRADEMARK OFFICE
CERTIFICATE OF CORRECTION

PATENT NO. : 10,372,868 B2  
APPLICATION NO. : 14/886877  
DATED : August 6, 2019  
INVENTOR(S) : Yanxiang Huang, Chunshu Li and Meng Li Page 1 of 1

It is certified that error appears in the above-identified patent and that said Letters Patent is hereby corrected as shown below:

On the Title Page

Item (73), Replace "IMEC VZW, Leuven (BE)" with "IMEC VZW, Leuven (BE); KATHOLIEKE UNIVERSITEIT LEUVEN, KU LEUVEN R&D, Leuven (BE)"

Signed and Sealed this  
Fifth Day of November, 2019

Andrei Iancu  
*Director of the United States Patent and Trademark Office*